(12) United States Patent
Ni et al.

(10) Patent No.: US 9,069,253 B2
(45) Date of Patent: Jun. 30, 2015

(54) MASK STRUCTURE

(71) Applicant: Nanya Technology Corp., Taoyuan (TW)

(72) Inventors: Yu-Mei Ni, Taoyuan (TW); Chun-Yen Huang, Taoyuan (TW); Pei-Cheng Fan, Taoyuan (TW)

(73) Assignee: Nanya Technology Corportion, Taoyuan (TW)

( * ) Notice: Subject to any disclaimer, the term of this patent is extended or adjusted under 35 U.S.C. 154(b) by 75 days.

(21) Appl. No.: 13/801,945

(22) Filed: Mar. 13, 2013

(65) Prior Publication Data

US 2014/0272674 A1    Sep. 18, 2014

(51) Int. Cl.
*G03F 1/22*    (2012.01)
*G03F 1/24*    (2012.01)

(52) U.S. Cl.
CPC ........................................ *G03F 1/22* (2013.01)

(58) Field of Classification Search
USPC .................. 430/5, 322, 323, 394; 428/432
See application file for complete search history.

(56) References Cited

U.S. PATENT DOCUMENTS

| | | | |
|---|---|---|---|
| 6,178,221 B1 | 1/2001 | Levinson et al. | |
| 6,984,475 B1 | 1/2006 | Levinson et al. | |
| 8,227,152 B2* | 7/2012 | Hayashi | 430/5 |
| 2005/0084768 A1 | 4/2005 | Han et al. | |
| 2011/0027703 A1* | 2/2011 | Shoki | 430/5 |
| 2013/0323626 A1* | 12/2013 | Chang | 430/5 |

* cited by examiner

*Primary Examiner* — Stephen Rosasco

(57) ABSTRACT

A mask structure, including a substrate; an absorber layer formed on the substrate; and a patterned reflection layer formed on the absorber layer. Optionally, the mask structure may further include a buffer layer, a conductive coating, or combinations thereof. The buffer layer may be formed between the absorber layer and the reflection layer, and the conductive coating may be formed at a back side of the substrate.

8 Claims, 2 Drawing Sheets

MASK STRUCTURE

BACKGROUND

1. Technical Field

The present disclosure relates to an optical component, and in particular relates to a mask structure.

2. Description of the Related Art

Lithography has been used in the semiconductor industry as one of critical techniques in manufacturing integrated circuits (ICs). Typically, lithography is used to create a pattern on a resist layer on a substrate such as a semiconductor wafer, with the pattern being an IC layout later to be formed on the substrate through the performance of subsequent steps such as etching and other steps. The wavelength of light used in lithography determines the pattern size and thus the feature size of the IC layout. Generally, feature size is proportional to the wavelength of the light used in the lithography process. As demand for semiconductor devices with smaller IC features and higher integration densities continues to grow, the wavelength of light has to decrease. Currently, lithography with wavelengths into the deep ultraviolet region (using deep ultraviolet light at 193 nm) has been used to create smaller IC features. However, for even smaller IC features to be created, even shorter wavelengths have to be used. Thus, to overcome the limiting resolution of patterns formed in the lithography process next generation lithography has been developed, and extreme ultraviolet lithography (EUVL) (using 13.5 nm EUV light) has emerged as one promising candidate.

Due to great absorption of EUV light in many materials, one major difference between EUVL and conventional lithography techniques using visible or UV light is that EUV relies on the principle of light reflection since it is almost impossible to use refractive optical elements such as lenses and transmission masks. In EUVL, a mask including an optical reflection structure and an absorber pattern corresponding to a pattern to be formed on a wafer is used, and when an EUV light is projected onto the mask, the absorber pattern absorbs a portion of the light and the optical reflection structure reflects the remainder of light onto the wafer to form the pattern. However, the performance of currently available EUV masks has not been satisfactory in all aspects. Thus, an improved EUV mask is needed.

BRIEF SUMMARY

The disclosure provides a mask structure comprising: a substrate; an absorber layer formed on the substrate; and a reflection layer formed on the absorber layer, wherein the reflection layer has a pattern.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers.

Figure 1:
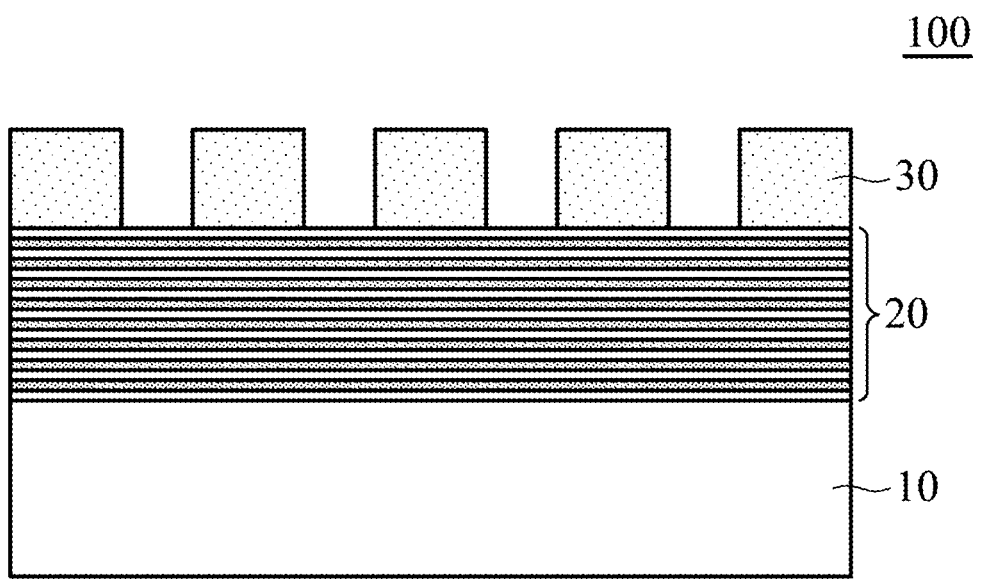
FIG. 1 is cross sectional view of a conventional EUV mask structure.

FIG. 1 illustrates a cross sectional view of a conventional EUV mask structure 100. In FIG. 1, the EUV mask structure 100 comprises a reflection layer 20 formed on a substrate 10. An absorber pattern 30 corresponding to a pattern to be formed on a wafer is formed on the reflection layer 20. The qualities of the absorber pattern 30 and the reflection layer 20 are critical to the properties of pattern formed on the wafer. If the reflection layer 20 and/or the absorber pattern 30 is defected, for example the absorber pattern 30 having an incorrect shape or the reflection layer comprising unintentionally incorporated impurities, the transferred pattern on the wafer may be distorted to give a defected wafer. Since the absorber pattern 30 is formed on the top of the EUV mask structure 100, defect detection and repair for the absorber layer 30 are facilitated. The defects may be repaired by processes such as deposition and etching. However, since the reflection layer 20 is located between the absorber layer 30 and the substrate 10, it is not only difficult to detect the defects therein but also difficult to repair these defects even when they have been detected. Thus, if an EUV mask structure having defects in the reflection layer is not identified prior to being used for patterning wafers, defected wafers will be produced, and a new cycle of EUV mask structure fabrication and wafer patterning is needed. Thus, failure to identify defected mask structures will significantly increase cycle time and manufacturing costs for production. Thus, it is desirable to develop an EUV mask where defects in the reflection layer 20 may be easily detected and repaired.

An improved EUV mask structure according to the disclosure will be described in detail below in reference to FIG. 2. It is understood that the mask structure according to the disclosure described herein can be employed not only in EUVL but in all projection-lithographic methods in principle.

Figure 2A:
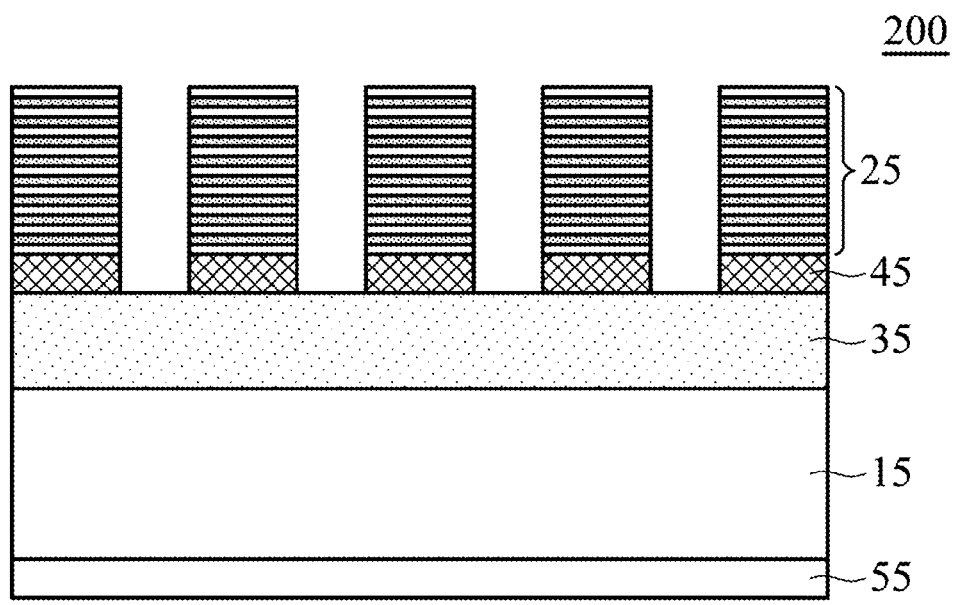
FIG. 2A is a cross sectional view of an EUV mask structure according to the disclosure.

FIG. 2A illustrates a side view of an EUV mask structure 200 according to the disclosure. It is understood that the mask structure 200 has been simplified for illustrative purposes, and depending on practical requirements, the mask structure 200 may comprise additional layers or elements for enhanced performance.

As shown in FIG. 2A, the mask structure 200 may comprise an absorber layer 35 formed on a substrate 15 and a reflection layer 25 formed on the absorber layer, wherein the reflection layer 25 has a pattern. Thus, when a light such as an EUV light is irradiated onto the mask structure 200, it is partially reflected by the patterned reflection layer 25 and partially absorbed by the absorber layer 35 according to the pattern. Thus, after the reflected light having the pattern projects onto the wafer, ideally the same pattern will be transferred onto the wafer.

Preferably, the substrate 15 is excellent in smoothness, flatness and resistance to an etchant or a cleaning liquid to be used for a mask structure blank or a mask structure. Preferably, the substrate 15 may be a substrate having a low coefficient of thermal expansion (CTE). For example, the substrate 15 may have a CTE of below 30 ppb/K at 22±-3° C.) In some embodiments, the substrate 15 may comprise quartz or silicon. The substrate 15 has a dimension properly determined according to the requirements for the mask structure 200. The absorber layer 35 may comprise TaN, TaBN, TaGeN, or TaBON. Alternatively, other suitable materials may be used for the absorber layer 35 as long as the material can absorb the incident EUV light.

The reflection layer 25 is not particularly limited so long as it has properties as desired as a reflection layer for a mask structure, for example an EUV mask structure. One crucial property of the reflection layer 25 required for it to be used as a mask structure is high light reflectance. In preferred embodiments, the reflection layer 25 may be formed as a patterned multilayer stack having relatively high refractive index layers and relatively low refractive index layers alternatively stacked several times to achieve a high light reflectance. In more preferred embodiments, the reflection layer 25 may be formed as a patterned multilayer stack having alternating Si and Mo layers, where the Mo layers are used as relatively high refractive index layers and Si layers are used as relatively low refractive index layers. However, a multilayer stack comprising other materials may alternatively be used, such as a Ru/Si multilayer stack, a Mo/Be multilayer stack, a Mo compound/Si compound multilayer stack, a Si/Mo/Ru multilayer stack, a Si/Mo/Ru/Mo multilayer stack, a Si/Ru/Mo/Ru multilayer stack and so on. Depending on the multilayer stack materials and the light reflectance required for the reflection layer 25, the thicknesses and the number of repeating units of the layers may be properly selected. The reflection layer 25 may be formed to a thickness sufficient to reflect an EUV light. For example, the reflection layer 25 may have a thickness of 280-350 nm.

A buffer layer 45 may be optionally formed between the absorber layer 35 and the reflection layer 25. In some embodiments, the buffer layer 45 may comprise, but is not limited to, $SiO_2$, Cr, or CrN.

In some embodiments, the mask structure 200 may further comprise a conductive coating 55 formed on a back side of the substrate 15 to allow for electrostatic chucking. The conductive coating 55 may comprise Cr or CrN, or other suitable materials.

In general, any suitable method known to one skilled in the art may be employed to form the mask structure 200. For example, a plurality of layers comprising the absorber layer 35, the buffer layer 45, and the reflection layer 25 may be first deposited on the substrate 15 in the order described, to produce the structure shown in FIG. 2B. The structure of FIG. 2B may be referred to as a mask blank structure. Then, the reflection layer 25 may be patterned to form the mask structure 200. It is understood that other steps may be performed and additional layers may be formed for the mask structure 200.

Figure 2B:
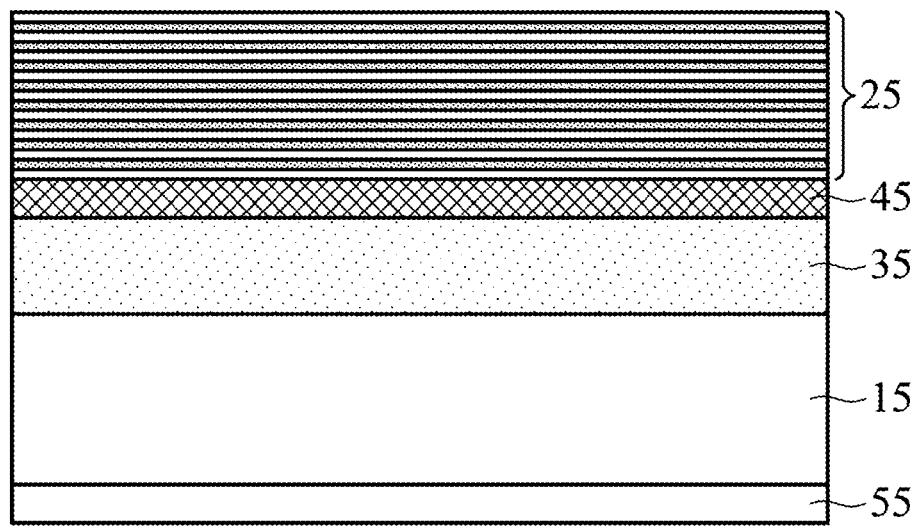
FIG. 2B is a cross sectional view of an EUV mask blank structure according to the disclosure.

The reflection layer 25 in FIG. 2B may be formed by a deposition process followed by a patterning process. In some embodiments, the deposition process may include, but is not limited to, physical vapor deposition, chemical vapor deposition, ion beam deposition, atomic layer deposition, or combinations thereof. For example, the method for depositing a multilayer stack of thin films on a substrate by combining ion beam deposition and atomic layer deposition as disclosed in U.S. Pat. No. 7,326,502 can be used to form the reflection layer 25, and it is incorporated herein in its entirety. In some embodiments, the patterning process may include conventional lithography and etch processes.

Compared with the conventional EUV mask structure 100 shown in FIG. 1, the absorber layer and the reflection layer of the mask structure 200 in FIG. 2A have reversed their positions relative to the substrate. The reflection layer 25 being located at the top allows easier access for defect detection and repair compared with the conventional EUV mask structure. Although it may now be more difficult for defect defection and repair of the absorber layer as it is between the reflection layer 25 and the substrate 15, the defects in absorber layer are less detrimental to patterns formed on wafers compared with that in the reflection layer because the absorber layer only absorbs but not reflect the incident light, so these defects may be ignored.

Thus, the mask structure of the disclosure described herein offers many advantages. One advantage includes easier access to the reflection layer for defect detection and repair, which leads to decreased cycle time and manufacturing costs. Another advantage includes compatibility with existing technologies so that minimal or no modification has to be made to the process or the machines for fabricating the mask structure according to the disclosure.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mask structure, comprising:
   a substrate;
   an absorber layer formed on the substrate; and
   a patterned reflection layer formed on the absorber layer and located at a top of the mask structure, wherein the patterned reflection layer is a multilayer stack having alternative layers of a relatively high refractive index material and a relatively low refractive index material, and is configured to reflect an EUV light.

2. The mask structure as claimed in claim 1, wherein the substrate comprises quartz or silicon.

3. The mask structure as claimed in claim 1, wherein the multilayer stack comprises a Ru/Si multilayer stack, a Mo/Be multilayer stack, a Mo compound/Si compound multilayer stack, a Si/Mo/Ru multilayer stack, a Si/Mo/Ru/Mo multilayer stack, or a Si/Ru/Mo/Ru multilayer stack.

4. The mask structure as claimed in claim 1, further comprising a buffer layer between the absorber layer and the reflection layer.

5. The mask structure as claimed in claim 4, wherein the buffer layer comprises $SiO_2$, Cr, or CrN.

6. The mask structure as claimed in claim 1, further comprising a conductive coating formed at a back side of the substrate.

7. The mask structure as claimed in claim 6, wherein the conductive coating comprises Cr or CrN.

8. The mask structure as claimed in claim 1, wherein the absorber layer comprises TaN, TaBN, TaGeN, or TaBON.

* * * * *